US010222241B2

(12) United States Patent
Lamesch

(10) Patent No.: US 10,222,241 B2
(45) Date of Patent: Mar. 5, 2019

(54) CAPACITANCE MEASUREMENT CIRCUIT FOR SENSE-ONLY CAPACITIVE SENSORS OPERATED IN MODE OF MEASURING A DISPLACEMENT CURRENT CAUSED BY THE PRESENCE OF A GROUNDED OBJECT

(71) Applicant: IEE International Electronics & Engineering S.A., Echternach (LU)

(72) Inventor: Laurent Lamesch, Reichlange (LU)

(73) Assignee: IEE International Electronics & Engineering S.A., Echternach (LU)

( * ) Notice: Subject to any disclaimer, the term of this patent is extended or adjusted under 35 U.S.C. 154(b) by 0 days.

(21) Appl. No.: 15/525,011

(22) PCT Filed: Nov. 4, 2015

(86) PCT No.: PCT/EP2015/075731
§ 371 (c)(1),
(2) Date: May 5, 2017

(87) PCT Pub. No.: WO2016/071407
PCT Pub. Date: May 12, 2016

(65) Prior Publication Data
US 2017/0314971 A1   Nov. 2, 2017

(30) Foreign Application Priority Data
Nov. 6, 2014   (LU) .......................................... 92592

(51) Int. Cl.
G01R 27/26   (2006.01)
G01D 5/24   (2006.01)
(Continued)

(52) U.S. Cl.
CPC ........... G01D 5/24 (2013.01); G01R 27/2605 (2013.01); B60N 2/002 (2013.01); B60R 21/01532 (2014.10)

(58) Field of Classification Search
CPC ...... G01D 5/24; G01R 27/26; G01R 27/2605; G06F 3/048; G06F 3/044; G06F 3/0416; G06F 3/0418
See application file for complete search history.

(56) References Cited

U.S. PATENT DOCUMENTS

| 8,570,053 B1 | 10/2013 | Ryshtun et al. |
| 2009/0295460 A1 | 12/2009 | Gulba et al. |
| 2012/0043973 A1* | 2/2012 | Kremin ................... G06F 3/044 |
| | | 324/658 |

FOREIGN PATENT DOCUMENTS

| JP | H1178655 A | 3/1999 |
| WO | WO2014166780 A1 | 10/2014 |

OTHER PUBLICATIONS

"Sigma-Delta ADCs and DACs", AN-283 Application Note, Analog Devices, 1993, 16 pages.
(Continued)

Primary Examiner — Minh N Tang
(74) Attorney, Agent, or Firm — Reising Ethington P.C.

(57) ABSTRACT

A capacitance measurement circuit for determining a capacitance of a guard-sense capacitive sensor includes a microcontroller that uses a combination of several synchronized PWM outputs for generating a low distortion sine wave. The sine wave is used as a guard voltage for the guard electrode of the capacitive sensor. The capacitance value of an unknown capacitor is measured by impinging the guard voltage on the sense electrode of the capacitive sensor by a modified sigma-delta modulator unit. The digital output of the sigma-delta modulator unit is first multiplied by an XOR gate before being routed into a decimator/low pass filter. The second input of the XOR gate is driven by a square wave from a square wave generator with the same frequency as the guard voltage, but with a substantially 90° phase shift. The
(Continued)

output of the decimator/low pass filter is indicative of the capacitance value of the unknown capacitor.

11 Claims, 5 Drawing Sheets

(51) Int. Cl.
*B60R 21/015* (2006.01)
*B60N 2/00* (2006.01)

(56) References Cited

OTHER PUBLICATIONS

J. Smith et al., Electric field sensing for graphical interfaces, IEEE Comput. Graph. Appl., 18(3): 1998, pp. 54-60.
International Search Report for International application No. PCT/EP2015/075731, dated Feb. 10, 2016, 4 pages.
Written Opinion for International application No. PCT/EP2015/075731, dated Feb. 10, 2016, 7 pages.

* cited by examiner

CAPACITANCE MEASUREMENT CIRCUIT FOR SENSE-ONLY CAPACITIVE SENSORS OPERATED IN MODE OF MEASURING A DISPLACEMENT CURRENT CAUSED BY THE PRESENCE OF A GROUNDED OBJECT

TECHNICAL FIELD

The invention generally relates to a capacitance measurement circuit for a guard-sense capacitive sensor operated in loading mode, in particular for vehicle applications, a method of measuring capacitance of such capacitive sensors using such capacitance measurement circuit and a software module for carrying out the method.

BACKGROUND ART

Vehicle capacitive detection systems comprising capacitive sensors operated in loading mode are nowadays widely used, for instance for the purpose of detection of vehicle seat occupancy. The capacitive sensors may be designed as sense-only capacitive sensors having a single sense electrode. Alternatively, they may be designed as guard-sense capacitive sensors, having a sense electrode and a guard electrode proximally arranged and mutually insulated from each other.

For example, document JP-H11-78655 describes a vehicle seat occupancy detecting apparatus including electric field sensors. A high frequency oscillator whose frequency is about 100 kHz is connected via a resistor to an antenna electrode arranged on an automobile seat. By this, a differential AC electric field is generated between the antenna electrode and the automobile ground, so that a load current corresponding to the AC electric field flows through the resistor. The AC load current is converted by the resistor into an AC voltage which is then transmitted by a voltage buffer to a detector including a bandpass filtering function which generates a DC output voltage.

If an occupant is seated on the seat, the current flowing between the antenna electrode and the automobile ground is increased, indicating the presence of the occupant on the seat.

Further, in the field of measuring technology employing sigma-delta modulators is commonly known, and numerous relevant literature is available on this topic, for instance: "Sigma-Delta ADCs and DACs", AN-283 Application Note, Analog Devices, 1993.

U.S. Pat. No. 8,570,053 B1 describes an application of a sigma-delta modulator for measurements of unknown capacitance values by a capacitive sensor. The capacitive sensor includes a switching capacitor circuit, a comparator, and a charge dissipation circuit. The switching capacitor circuit reciprocally couples a sensing capacitor in series with a modulation capacitor during a first switching phase and discharges the sensing capacitor during a second switching phase. The comparator is coupled to compare a voltage potential on the modulation capacitor to a reference and to generate a modulation signal in response. The charge dissipation circuit is coupled to the modulation capacitor to selectively discharge the modulation capacitor in response to the modulation signal.

SUMMARY

It is desirable to provide a simple capacitance measurement circuit comprising low cost hardware components for determining a complex capacitance of a guard-sense capacitive sensor operated in loading mode, in particular for use in vehicles and complying with automotive electromagnetic compatibility (EMC) requirements.

The term "vehicle", as used in this application, shall particularly be understood to encompass passenger cars, trucks and buses.

It is therefore an object of the invention to provide a capacitance measurement circuit for determining a capacitance of a guard-sense capacitive sensor operated in loading mode, employing less hardware parts and/or low-cost hardware parts, but still meeting automotive electromagnetic compatibility (EMC) requirements.

In one aspect of the present invention, the object is achieved by a capacitance measurement circuit for determining a capacitance of a guard-sense capacitive sensor operated in loading mode. The capacitance measurement circuit comprises a sine wave generator that is configured to generate a substantially sinusoidal electrical signal having a test frequency, a square wave generator that is configured to generate an electrical signal of substantially square wave shape at the test frequency, a guard-sense capacitive sensor including an electrically conductive sense electrode and an electrically conductive guard electrode proximally arranged and mutually insulated from each other, wherein the guard electrode is connected to an output port of the sine wave generator, and a signal sensing circuit.

The term "loading mode", as used in this application, shall be understood particularly as a mode of measuring a displacement current caused by the presence of a grounded object in proximity of a single sense electrode (cf. J. Smith et al., Electric field sensing for graphical interfaces, IEEE Comput. Graph. Appl., 18 (3):54-60, 1998).

The signal sensing circuit includes a sigma-delta modulator unit having an integrator unit that includes a 1-bit digital-to-analog converter, a quantizer unit including a comparator member with a signal input port and a reference input port and a clocked digital latch member that is connected in series to an output port of the comparator member, and a digital decimator/low pass filter. An output port of the quantizer unit is connected to an input port of the 1-bit digital-to-analog converter, and an output port of the 1-bit digital-to-analog converter is connected to the signal input port of the comparator member, so as to form a closed feedback loop. The sense electrode is, for frequencies as high as the test frequency or lower, connected to the signal input port. The guard electrode is connected to the reference input port of the comparator member.

Further, the signal sensing circuit includes a digital decimator/low pass filter. Decimators for decimating a bit stream generated by the sigma-delta modulator and digital low pass filters are known to those skilled in the art and shall therefore not be described in more detail herein. Any digital decimator/low pass filter that appears to be suitable to the personal skilled in the art may be employed.

Furthermore, the signal sensing circuit includes a digital XOR gate having at least two input ports. The output port of the electronic latch member is connected to a first input port of the at least two input ports of the digital XOR gate, the second input port of the at least two input ports is connected to an output port of the square wave generator, and an output port of the digital XOR gate is connected to an input port of the digital decimator/low pass filter.

Moreover, the signal sensing circuit comprises a microcontroller having a processor unit, a digital memory unit and a microcontroller system clock. The microcontroller is configured to determine the capacitance based on evaluating a ratio of a number of clock periods when the output level of the XOR gate is high to the total amount of clock periods during the measurement time.

Such equipped microcontrollers are commercially available nowadays in many variations. The type of microcontroller that is contemplated for use in this invention is a low-cost type with very restricted capabilities. For instance, the microcontrollers under consideration do not include a digital signal processor (DSP), and a frequency of the microcontroller system clock is lower or equal to 10 MHz.

One advantage of the capacitance measurement circuit in accordance with the invention lies in that the capacitance of the capacitive sensor can reliably be determined with reduced effort and cost.

Another advantage lies in that, by making use of an adapted sigma-delta modulator, a high resolution for determining the capacitance of the capacitive sensor can be accomplished.

In a preferred embodiment, a relative phase shift between the sinusoidal electrical signal of the sine wave generator and the electrical signal of substantially square wave shape of the square wave generator is substantially equal to 90°. In this case, the digital XOR gate inverts a logical output of the clocked latch member during the second and the third quarter of a wave period of the sine wave generator, and does not invert the logical output of the clocked latch member during the first and fourth quarter of a wave period. In this way, the determining of the capacitance can in principle be simplified to counting the number of clock periods when the output level of the XOR gate is high. The ratio of this number to the total amount of clock periods during the measurement time is then calculated.

In another preferred embodiment, the microcontroller further comprises a plurality of synchronized pulse width modulation units that are configured to operate at the test frequency, and a low pass filter unit. The plurality of synchronized pulse width modulation units and the low pass filter unit form the sine wave generator. The microcontroller is configured to weight and to sum output signals of the plurality of synchronized pulse width modulation units for generating a sinusoidal signal of the test frequency at an output of the low pass filter unit. By that, a required hardware effort can be reduced by employing microcontrollers of a low-cost type that do not include a digital signal processor.

In yet another preferred embodiment, the digital decimator/low pass filter comprises a gated counter that is an integral part of the microcontroller. In this way, a capacitance measurement circuit of compact design can be provided.

In one embodiment, one synchronized pulse width modulation unit of the plurality of synchronized pulse width modulation units is configured to serve as the square wave generator. By that, the number of discrete components can be reduced and the capacitance measurement circuit simplified.

A similar benefit can be achieved if the microcontroller further comprises a clock output port that is connected to a clock input port of the clocked digital latch member. Alternatively a clock source external to the microcontroller can be used instead of the internal microcontroller clock source.

In another preferred embodiment, the test frequency lies in a range between 1 kHz and 1 MHz, and the clock output port is configured to provide a clock signal having a frequency that is at least ten times the test frequency. The oversampling rate is sufficiently high and, in the selected frequency range, the time required for determining the capacitance is sufficiently short for many applications, in particular for automotive applications, and hardware components of the capacitance measurements circuit are inexpensive and easily available, as low-cost type microcontrollers having a system clock frequency of less than or equal to 10 MHz can be employed. It will of course be noted that microcontrollers having a system clock frequency of more than 10 MHz can also be used.

In one embodiment, the guard electrode is connected to the output port of the sine wave generator via a conducting shield of a shielded cable, and the sense electrode is connected to the signal input port of the comparator member via an inner conductor of the shielded cable. In this way, a solution for connecting the guard-sense capacitive sensor with the measurement circuit with a low level of electromagnetic radiation can readily be provided.

In another aspect of the invention, a method is provided for determining a capacitance of a guard-sense capacitive sensor operated in loading mode by using an embodiment of the capacitance measurement circuit is disclosed herein.

The method comprises the following steps:
resetting an output of the digital decimator/low pass filter,
enable applying the sinusoidal electrical signal to the guard electrode,
enable applying the electrical square wave signal to the second input port of the digital XOR gate,
enable clocking of the clocked digital latch member,
determine numbers of clock periods where the output level of the XOR gate is high,
after a pre-determined measurement time, stop clocking of the clocked digital latch member,
determine a ratio of clock periods where the output level of the XOR gate is high to the total amount of clock periods during the pre-determined measurement time,
determine the capacitance based on evaluating the ratio of numbers of clock periods where the output level of the XOR gate is high to the total amount of clock periods.

In a suitable embodiment, the benefits of the capacitance measurements circuit as presented before can be achieved, and the capacitance of the guard-sense capacitive sensor operated in loading mode can be determined with little hardware effort in a fast, reliable and reproducible way.

In another preferred embodiment, the method comprises preceding steps of
combining a plurality of synchronized output signals having the test frequency, the plurality of synchronized output signals being generated by the plurality of synchronized pulse width modulation units, by weighted summing of the synchronized output signals, and
applying low pass filtering to the summed output signals to generate a substantially sinusoidal test signal of the test signal frequency. In a suitable embodiment, the level of electromagnetic radiation can be kept low, thus enabling to comply with EMC requirements, in particular for automotive applications, with reduced hardware and cost effort.

In yet another preferred embodiment, the method comprises steps of
varying a relative phase shift between the sinusoidal electrical signal of the sine wave generator and the electrical signal of substantially square wave shape of the square wave generator in pre-determined steps in a pre-determined range and keep the relative phase constant for a pre-determined measurement time period, determining the capacitance in each of the measurement time periods, determining an optimum relative phase shift that corresponds to the determined capacitance of largest magnitude, adjusting the relative phase shift to the optimum relative phase shift.

In this way, any phase-shifting effects of the signal sensing circuit or employed filter members can be compensated for and an improved signal quality for determining the capacitance can be obtained.

In yet another aspect of the invention, a software module for controlling an execution of steps of an embodiment of the method disclosed herein is provided.

The method steps to be conducted are converted into a program code of the software module, wherein the program code is implementable in the digital memory unit of the microcontroller and is executable by the processor unit of the microcontroller.

The software module can enable a robust and reliable execution of the method and can allow for a fast modification of method steps.

These and other aspects of the invention will be apparent from and elucidated with reference to the embodiments described hereinafter.

BRIEF DESCRIPTION OF THE DRAWINGS

Further details and advantages of the present invention will be apparent from the following detailed description of a not limiting embodiment with reference to the attached drawings, in which.

DETAILED DESCRIPTION

Figure 1:
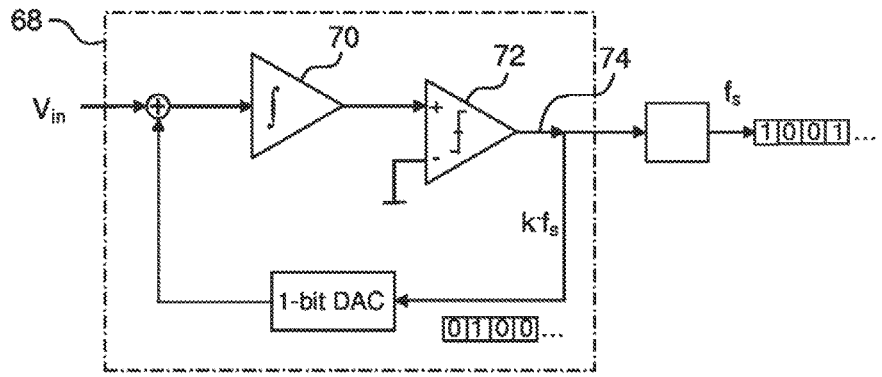
FIG. 1 is a block diagram of a conventional sigma-delta modulator.

FIG. 1 is a block diagram of a conventional first-order sigma-delta modulator 68. It comprises an analog latched comparator 72 (in principle a latched 1-bit analog-to-digital converter) connected in series to an integrator 70. The comparator 72 is clocked at an oversampling frequency k·fs, with k denoting an oversampling factor. The input signal that is applied to the integrator 70 is the difference of the input voltage $V_{in}$ to be measured and an output voltage of a 1-bit digital-to analog converter whose input is connected to the 1-bit data stream (bitstream) generated by the latched comparator 72. The bitstream of sampling rate k·fs is processed in a digital decimator/low pass filter to a bitstream of sampling rate $f_s$. If an amplitude of the input voltage to be measured increases, the "HIGH" state is predominant in the bitstream. If the amplitude of the input voltage to be measured decreases, the "LOW" state is predominant in the bitstream. For a more detailed description of the sigma-delta modulator function and properties, reference is made to the relevant literature, for instance the reference cited in section "Background Art".

Figure 2:
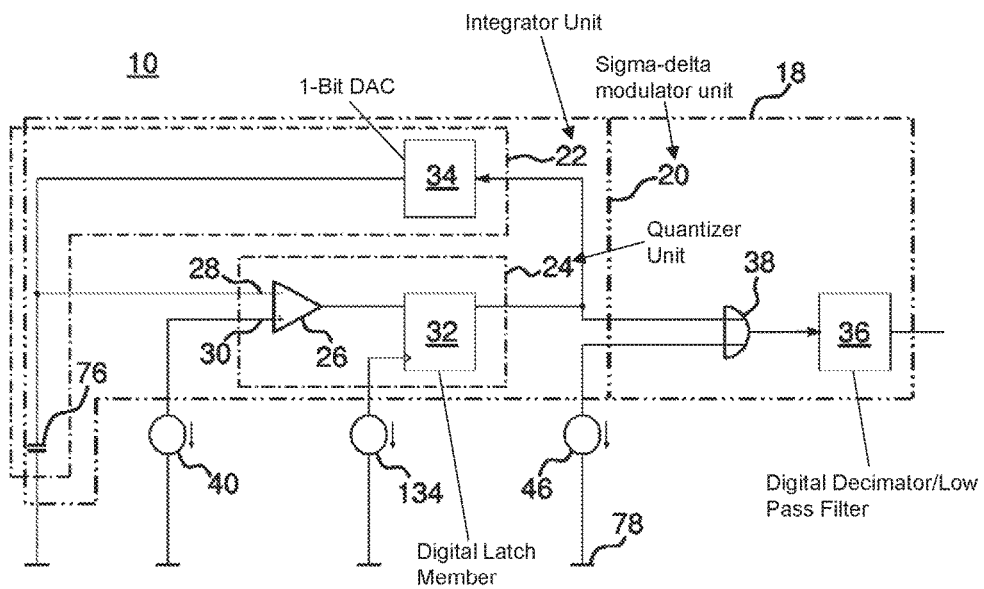
FIG. 2 illustrates a block diagram of an embodiment of the capacitance measurement circuit in accordance with the invention.

FIG. 2 illustrates a block diagram of an embodiment of the capacitance measurement circuit 10 for determining a capacitance value of a guard-sense capacitive sensor 12 (see also FIG. 3) operated in loading mode in accordance with the invention.

The capacitance measurement circuit 10 includes a signal sensing circuit 18 comprising a modified sigma-delta modulator unit 20 having an integrator unit 22 and a quantizer unit 24.

The quantizer unit 24 includes a comparator member 26 with a signal input port 28 and a reference input port 30.

The capacitance measurement circuit 10 further comprises a guard-sense capacitive sensor 12 (see FIG. 3) including an electrically conductive sense electrode 14 and an electrically conductive guard electrode 16 proximally arranged to and mutually insulated from each other. An approaching object of unknown capacitance, for instance a seat occupant, electrically interacts with the guard-sense capacitive sensor 12 and, by that, changes the capacitance value of the guard-sense capacitive sensor 12, which is sensed by the capacitance measurement circuit 10.

Figure 3:
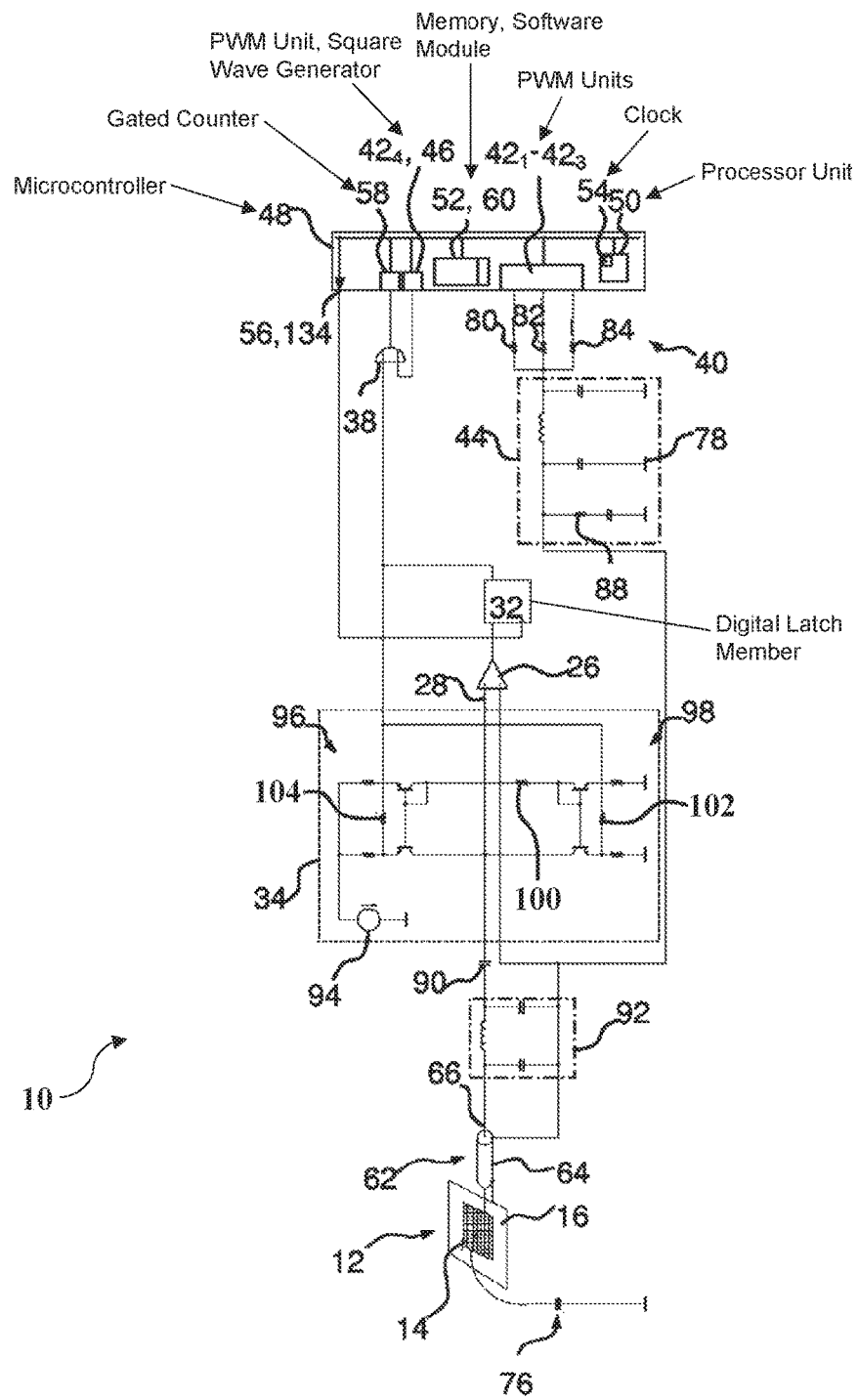
FIG. 3 shows a detailed circuit diagram of the embodiment of the capacitance measurements circuit pursuant to FIG. 2.

The interaction between the unknown capacitor 76 and the guard-sense capacitive sensor 12 is indicated in FIG. 3 by a curved solid line emerging from the unknown capacitor 76 and ending at the sense electrode 14.

The guard electrode 16 is connectable to the reference input port 30 of the comparator member 26, and the sense electrode 14 is connectable to the signal input port 28 of the comparator member 26. FIG. 3 shows the guard-sense capacitive sensor 12 in an operational state, connected to the input ports 28, 30 of the comparator member 26.

Making reference again to FIG. 2, the reference input port 30 of the comparator member 26 (and therewith the guard electrode 16) is connected to an output port of a sine wave generator 40. The sine wave generator 40 is configured to generate a substantially sinusoidal electrical signal having a test frequency ("test signal") that is selectable in a range between 1 kHz and 1 MHz. in this particular embodiment, the test frequency is selected at 100 kHz, and the peak amplitude at the output port of the sine wave generator 40 is 0.5 V.

The quantizer unit 24 further comprises a digital latch member 32 designed as a D flip-flop that is connected in series to an output port of the comparator member 26. The digital latch member 32 is clocked by a clock source 134 providing a clock signal having a frequency that is at least ten times the test frequency. In this particular embodiment, the frequency of the clock signal is 10 MHz.

The integrator unit 22 of the modified sigma-delta modulator unit 20 includes a 1-bit digital-to-analog converter (DAC) 34 with a bipolar current output. If the 1-bit DAC input port is at a voltage level corresponding to logic state "HIGH", a current with a fixed pre-determined level flows out of the DAC output port. If the DAC input port is at a voltage level corresponding to logic state "LOW", a current of the same fixed pre-determined level flows into the DAC output port. The integrator unit 22 of the modified sigma-delta modulator unit 20 can be considered to also comprise the unknown capacitor 76, connected between the DAC output port and a circuit ground 78.

An output port of the quantizer unit 24, formed by the output port of the clocked digital latch member 32, is connected to the input port of the 1-bit DAC 34. The 1-bit DAC output port is connected to the signal input port 28 of the comparator member 26, so as to form a closed feedback loop.

The feedback loop keeps a voltage at the signal input port 28 substantially equal to a voltage at the reference input port 30, which is driven by the sine wave generator 40. Therefore, during operation a sine wave of the same frequency and amplitude as the sine wave generated by the sine wave generator 40 will appear at the unknown capacitor 76, superimposed by a voltage generated by applying the output current of the 1-bit DAC 34 to the unknown capacitor 76.

A number of positive and negative current pulses injected by the 1-bit DAC 34 into the unknown capacitor 76 for keeping the feedback loop stable during the first and last quarter of a period of the applied electrical test signal (i.e. during increasing voltage level) and a number of positive and negative current pulses injected by the 1-bit DAC 34 into the unknown capacitor 76 during the second and third quarter of the period of the applied electrical test signal (i.e. during decreasing voltage level) will be indicative of an amplitude of the electrical test signal and of a capacitance of the unknown capacitor 76. The higher the capacitance, the more positive current pulses during the first and last quarter of the period of the applied electrical test signal and the more negative current pulses during the second and third quarter of the period of the applied electrical test signal will be generated.

The signal sensing circuit 18 further comprises a digital XOR gate 38, having two input ports, that is operated as a digital multiplier. One input port of the two input ports is connected to an output port of a square wave generator 46. The square wave generator 46 is configured to generate an electrical signal of substantially square wave shape at the test frequency. A relative phase shift between the electrical test signal of the sine wave generator 40 and the electrical signal of the square wave generator 46 is substantially equal to 90° and an equivalent phase shift of the time of one period of the clock source 134 that is clocking the digital latch member 32. The square wave generator 46 is operated in a synchronized way with the clock source 134. In this way, an output voltage level of the square wave generator 46 changes its state synchronous to an active clock edge at the digital latch member 32.

The other input port of the two input ports of the digital XOR gate 38 is connected to the output port of the digital latch member 32. The digital XOR gate 38 inverts the output level of the digital latch member 32, which is indicative of the actual current pulse output of the 1-bit DAC 34 during the second and third quarter of a period of the test signal and does not invert the output level of the digital latch member 32, which is indicative of the actual current pulse output of the 1-bit DAC 34 during a first and last quarter of the period of the test signal. Therefore, the ratio between the number of the negative pulses and positive pulses at an output port of the digital XOR gate 38 will be indicative of the capacitance of the unknown capacitor 76. More specifically, the positive duty cycle at the output port of the digital XOR gate 38 will substantially be proportional to the capacitance of the unknown capacitor 76.

Then, the signal sensing circuit 18 includes a digital decimator/low pass filter 36. The output port of the digital XOR 38 gate is connected to an input port of the digital decimator/low pass filter 36. The digital decimator/low pass filter 36 decimates and low pass filters a pulse stream output generated at the output port of the digital XOR gate 38, which results in a digital word that is indicative of the unknown capacitance value of the unknown capacitor 76.

FIG. 3 shows a detailed circuit diagram of the embodiment of the capacitance measurements circuit 10 pursuant to FIG. 2.

As is shown in FIG. 3, the capacitance measurement circuit 10 comprises a microcontroller 48 that includes a processor unit 50, a digital memory unit 52, a microcontroller system clock 54 and a plurality of four synchronized pulse width modulation (PWM) units $42_1$-$42_4$ with square wave output signals. It is understood that data links (indicated in FIG. 3 as a data bus) exist that mutually connect the various components of the microcontroller 48. The microcontroller 48 is of a low-cost type with very limited capabilities, has a clock frequency of 10 MHz and does not include an integrated digital signal processor.

Three PWM units $42_1$-$42_3$ of the plurality of synchronized PWM units $42_1$-$42_4$ and a low pass filter unit 44 form the sine wave generator 40. The system is configured to weight and to sum output signals of the three PWM units $42_1$-$42_3$ of the plurality of synchronized PWM units $42_1$-$42_4$ having the test signal frequency of 100 kHz. For instance one resistor 80, 82, 84 each is connected to every output port of the three PWM units $42_1$-$42_3$ for weighted summing of all three PWM unit output signals.

Figure 4:
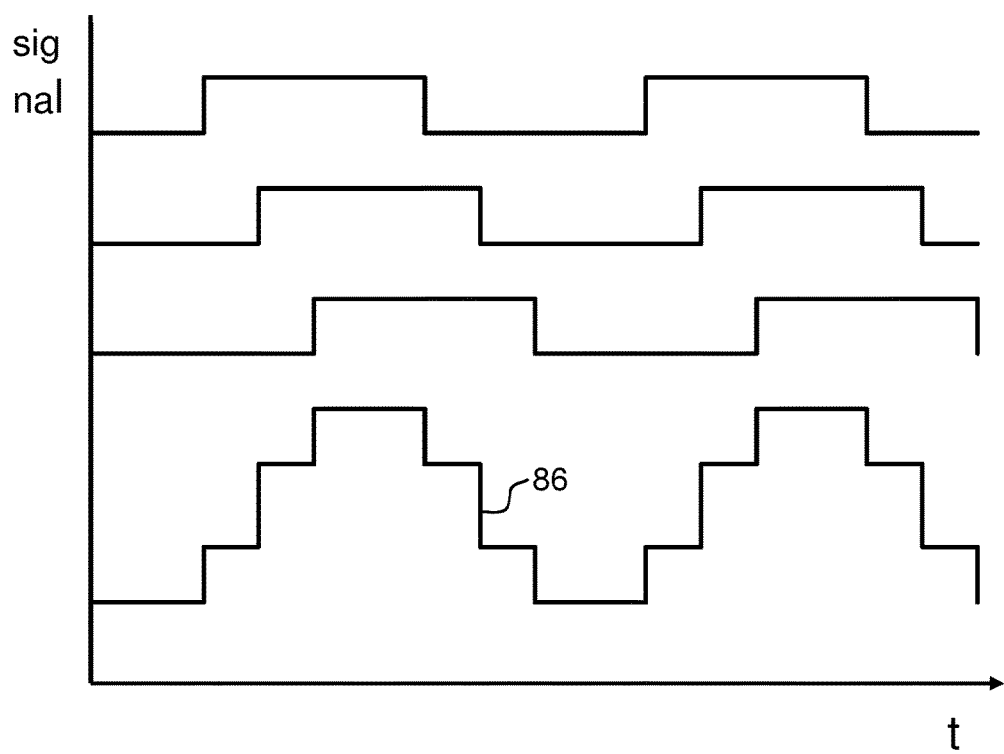
FIG. 4 shows a combination of a plurality of synchronized output signals of same test signal frequency, generated by synchronized pulse width modulation units of the microcontroller of the capacitance measurement circuit pursuant to FIG. 3.

The square wave PWM unit output signals are schematically shown in FIG. 4. The output signals have the same test signal frequency, with a defined relative phase shift among them. The output signal of PWM unit $42_2$ ($2^{nd}$ position in FIG. 4) is delayed by ⅛ period relative to the output signal of PWM unit $42_1$ (top position), and the output signal of PWM unit $42_3$ ($3^{rd}$ position) in turn is delayed by ⅛ period relative to the output signal of PWM unit $42_2$ ($2^{nd}$ position). The relative amplitudes of the PWM unit output signals as weighted by the resistors 80, 82, 84 are 1, √2 and 1, respectively. By summing the weighted PWM unit output signals, an approximated sine wave 86 is generated as indicated in the bottom part of FIG. 4. The $2^{nd}$ to $7^{th}$ harmonics of the approximated sine wave 86 are substantially suppressed.

The low pass filter unit 44, designed as an π-filter in n-configuration and an additional RC combination, is connected in series to the output of the pulse PWM units $42_1$-$42_3$ and substantially filters out most of the remaining harmonics. The output of the low pass filter unit 44 is a sinusoidal test signal having a frequency of 100 kHz and a low distortion factor. The source resistance of the low pass filter unit 44 is defined by the three resistors 80, 82, 84, and resistor 88 defines the load resistance of the low pass filter unit 44.

The clock source 134 for clocking the clocked digital latch member is provided by a clock output port 56 of the microcontroller 48, providing an electrical clock signal with a frequency of 10 MHz. The clock output port 56 is connected to a clock input port of the clocked digital latch member 32.

The comparator member 26 is an integral part of the microcontroller 48. The clocked digital latch member 32 is provided by a SN74LVC1G74 D flip-flop integrated circuit that is commercially available from several manufacturers. The digital XOR gate 38 is provided by a SN74LVC1G86 XOR gate integrated circuit that is also commercially obtainable from several manufacturers of integrated circuits.

Further, the digital decimator/low pass filter 36 comprises a gated counter 58 that is an integral part of the microcontroller 48. The output port of the digital XOR gate 38 is connected to an input port of the gated counter 58.

The guard electrode 16 of the guard-sense capacitive sensor 12 is connected to the output port of the sine wave generator 40 via a conducting shield 64 of a shielded cable 62, and the sense electrode 14 is connected to the signal input port 28 of the comparator member 26 via an inner conductor 66 of the shielded cable 62 and a capacitor 90 for direct current (DC) decoupling. A capacitance value of the DC-decoupling capacitor 90 is selected such that the impedance of the capacitor 90 is low enough to let the test signal pass substantially unattenuated. In this way, the sense electrode 14 is, for frequencies as high as the test frequency or lower, effectively connected to the signal input port 28. Any influence of leakage currents between the sense electrode 14 and the circuit ground 78 on the DC bias of the signal sensing circuit 18 is thereby effectively eliminated.

An additional EM radiation low pass filter unit 92 made out of two capacitors and an inductor in π-configuration is positioned between the inner conductor 66 and the conducting shield 64 of the shielded cable 62 at an end of the shielded cable 62 that is remote from the capacitive sensor 12. The EM radiation low pass filter unit 92 attenuates frequency components generated by the clock source 134 in the capacitive sensor 12 and related sensor wiring, while letting the test signal pass substantially unattenuated.

The 1-bit DAC 34 of the integrator unit 22 is powered by a DC voltage source 94 that has the same voltage as DC power supplies (not shown) for the comparator member 26, the clocked digital latch member 32, the digital XOR gate 38 and the microcontroller 48.

The 1-bit DAC 34 comprises two current mirror circuits 96, 98 which are alternately switched on and off by the voltage level at the output port of the digital latch member 32. Resistor 100 simultaneously sets an output current for both current mirror circuits 96, 98. By that, both output currents can be made substantially equal if the upper current mirror circuit 96 and the lower current mirror circuit 98 are made symmetric to each other.

If the voltage level at the output port of the digital latch member 32 corresponds to logical state "HIGH" (5 V), then resistor 102 will pull the electric potential of the emitter of a transistor of the lower current mirror circuit 98 up to a level that hinders any base current to flow, thereby disabling the lower current mirror circuit 98. The upper mirror circuit 96 is enabled at the same time. The current flowing out of the 1-bit DAC 34 into the unknown capacitor 76 is positive.

If the voltage level at the output port of the digital latch member 32 corresponds to logical state "LOW" (0 V), then the resistor 104 will pull the electric potential of the emitter of a transistor of the upper mirror circuit 96 low to a level that hinders any base current to flow, thereby disabling the upper current mirror circuit 96. The lower mirror circuit 98 is enabled at the same time. The current flowing out of the 1-bit DAC 34 into the unknown capacitor 76 is negative. In this specific embodiment, a level of the 1-bit DAC output current is exemplarily chosen to be 100 µA.

The square wave generator 46 is provided by the fourth PWM unit 42$_4$ of the plurality of synchronized PWM units 42$_1$-42$_4$. A phase shift between the combined three PWM output unit signals of the sine wave generator 40 and the fourth PWM output unit signal is adjustable by the microcontroller 48, as will be described below.

Figure 6:
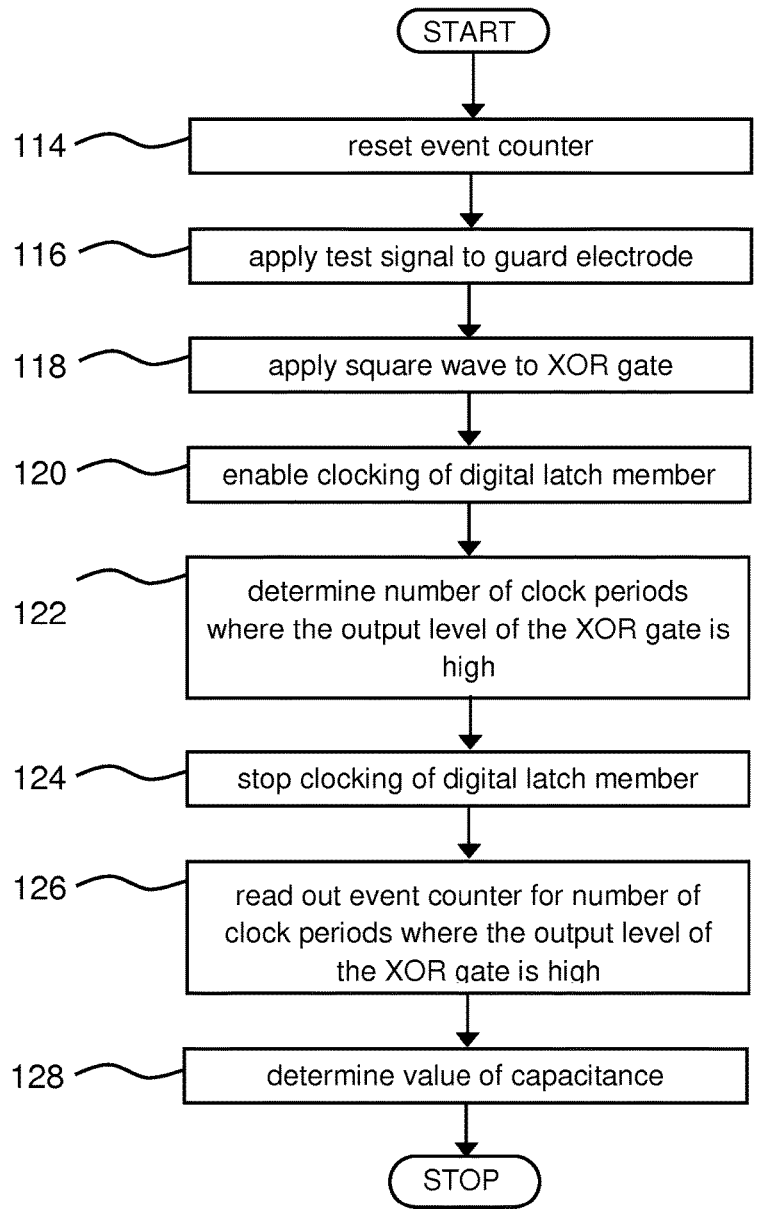
FIG. 6 is a flowchart of an embodiment of the method in accordance with the invention.

In the following, an embodiment of a method of determining a capacitance of the guard-sense capacitive sensor 12 operated in loading mode by using an embodiment of the capacitance measurement circuit 10 is described (FIG. 6). In preparation of measuring the capacitance of the guard-sense capacitive sensor 12 by the embodiment of the capacitance measurement circuit 10 pursuant to FIGS. 2 and 3, it shall be understood that all involved units and devices are in an operational state and configured as illustrated in FIGS. 2 and 3.

In order to be able to carry out the method, the microcontroller 48 comprises a software module 60. Method steps to be conducted are converted into a program code of the software module 60. The program code is implementable in the digital memory unit 52 of the microcontroller 48, and is executable by the processor unit 50 of the microcontroller 48.

Figure 5:
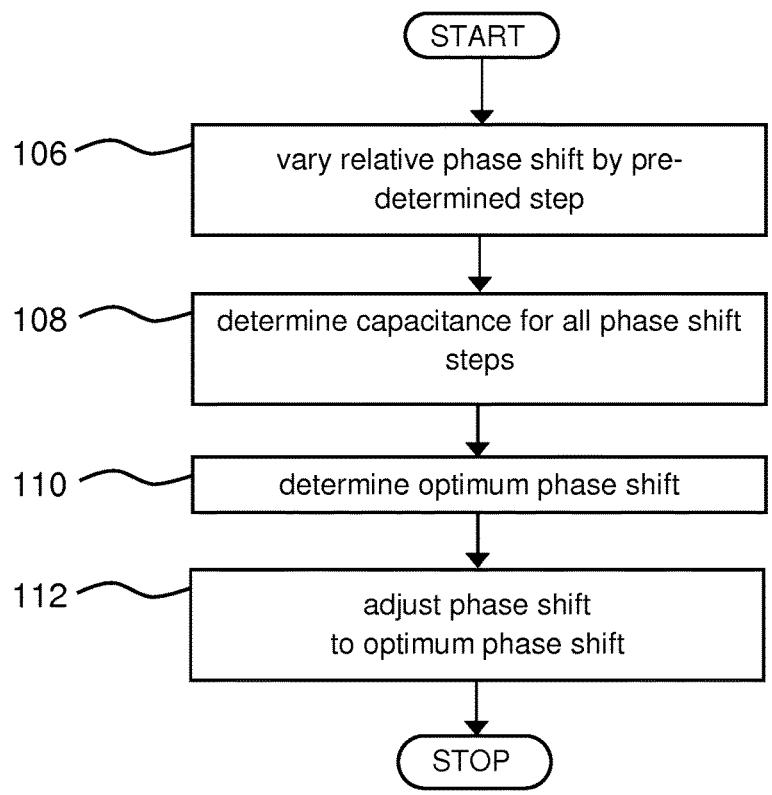
FIG. 5 is a flowchart of a series of optional steps that are an optional part of the method in accordance with the invention.

For determining an optimum phase shift between the three combined PWM output unit signals of the sine wave generator 40 and the output signal of the square wave generator 46, the following optional series of preparatory method steps is carried out (FIG. 5).

In a first preparatory step 106, the relative phase shift between the sinusoidal electrical signal of the sine wave generator 40 and the electrical signal of substantially square wave shape of the square wave generator 46 is varied in pre-determined steps of 5° in a pre-determined range between 80° and 100°, and the relative phase is kept constant for a pre-determined measurement time period.

In each of the measurement time periods of constant relative phase, the capacitance of the guard-sense capacitive sensor 12 is determined in a next preparatory step 108. In the following preparatory step 110, an optimum phase shift is determined as the relative phase shift corresponding to the determined capacitance of largest magnitude. In the final preparatory step 112 then, the relative phase shift is adjusted to the determined optimum relative phase shift.

For determining the capacitance of the guard-sense capacitive sensor 12 operated in loading mode, the following steps are carried out (FIG. 6).

In a first step of the method 114, the gated counter 58 is reset. In the following steps 116-120 then, applying the sinusoidal electrical signal to the guard electrode 16, applying the electrical square wave signal to the second input port of the digital XOR gate 38, and the clocking of the clocked digital latch member 32 is enabled.

In the next step 122 of the method, the number of clock periods where the output level of the XOR gate is high are determined by the gated counter 58 of the microcontroller 48.

After a pre-determined measurement time, which in this specific embodiment has been selected to be 100 ms, the clocking of the clocked digital latch member 32 is stopped in another step 124. In combination with the frequency of 10 MHz for the electrical clock signal, a measurement resolution of $1:10^6$ can be achieved in this way.

In the following step 126, a number of clock periods where the output level of the XOR gate is high during the pre-determined measurement time is determined by reading out the contents of the gated counter 58, which is indicative of the capacitance of the unknown capacitor 76. In another step 128, the capacitance is determined based on evaluating the number of clock periods where the output level of the XOR gate is high during the pre-determined measurement time.

While the invention has been illustrated and described in detail in the drawings and foregoing description, such illustration and description are to be considered illustrative or exemplary and not restrictive; the invention is not limited to the disclosed embodiments.

Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

The invention claimed is:

1. A capacitance measurement circuit for determining a capacitance of a guard-sense capacitive sensor, comprising
   a sine wave generator that is configured to generate a substantially sinusoidal electrical signal having a test frequency;
   a square wave generator that is configured to generate an electrical signal of substantially square wave shape at the test frequency;
   a guard-sense capacitive sensor including an electrically conductive sense electrode and an electrically conductive guard electrode proximally arranged and mutually insulated from each other, wherein the guard electrode is connected to an output port of the sine wave generator;
   a signal sensing circuit including
      a sigma-delta modulator unit having
         an integrator unit including a 1-bit digital-to-analog converter, and
         a quantizer unit including a comparator member with a signal input port and a reference input port, and a clocked digital latch member that is connected in series to an output port of the comparator member, wherein:
            an output port of the quantizer unit is connected to an input port of the 1-bit digital-to-analog converter,
            an output port of the 1-bit digital-to-analog converter is connected to the signal input port of the comparator member, so as to form a closed feedback loop,
            the sense electrode is connected to the signal input port of the comparator member, and
            the guard electrode is connected to the reference input port of the comparator member;
      a digital decimator with a low pass filter; and
      a digital XOR gate having at least two input ports, wherein the output port of the clocked digital latch member is connected to a first input port of the at least two input ports, the second input port of the at least two input ports is connected to an output port of the square wave generator, and an output port of the digital XOR gate is connected to an input port of the digital decimator;
   a microcontroller, including
      a processor unit,
      a digital memory unit, and
      a microcontroller system clock,
   wherein the microcontroller is configured to determine the capacitance based on evaluating a ratio of a number of clock periods when the output level of the XOR gate is high to a total amount of clock periods.

2. The capacitance measurement circuit as claimed in claim 1, wherein a relative phase shift between the sinusoidal electrical signal of the sine wave generator and the electrical signal of substantially square wave shape of the square wave generator is substantially equal to 90°.

3. The capacitance measurement circuit as claimed in claim 1, wherein the microcontroller further comprises
   a plurality of synchronized pulse width modulation units that are configured to operate at the test frequency, and
   a low pass filter unit,
   wherein the plurality of synchronized pulse width modulation units and the low pass filter unit form the sine wave generator, and wherein the microcontroller is configured to weight and to sum output signals of the plurality of synchronized pulse width modulation units for generating a sinusoidal signal of the test frequency at an output of the low pass filter unit.

4. The capacitance measurement circuit as claimed in claim 1, wherein the digital decimator comprises a gated counter that is an integral part of the microcontroller.

5. The capacitance measurement circuit as claimed in claim 3, wherein one synchronized pulse width modulation unit of the plurality of synchronized pulse width modulation units is configured to serve as the square wave generator.

6. The capacitance measurement circuit as claimed in claim 1, wherein the microcontroller further comprises a clock output port that is connected to a clock input port of the clocked digital latch member.

7. The capacitance measurement circuit as claimed in claim 1, wherein the test frequency lies in a range between 1 kHz and 1 MHz, and the clock output port is configured to provide a clock signal having a frequency that is at least ten times the test frequency.

8. The capacitance measurement circuit as claimed in claim 1, wherein the guard electrode is connected to the output port of the sine wave generator via a conducting shield of a shielded cable, and the sense electrode is connected to the signal input port of the comparator member via an inner conductor of the shielded cable.

9. A method of determining a capacitance of a guard-sense capacitive sensor using the capacitance measurement circuit as claimed in claim 1, the method comprising steps of:
   resetting an output of the digital decimator,
   applying the sinusoidal electrical signal to the guard electrode,
   applying the electrical square wave signal to the second input port of the digital XOR gate,
   clocking the clocked digital latch member,
   determining numbers of clock periods where the output level of the XOR gate is high,
   after a pre-determined measurement time, stopping clocking of the clocked digital latch member,
   determining a ratio of clock periods where the output level of the XOR gate is high to the total amount of clock periods during the pre-determined measurement time,
   determining the capacitance based on evaluating the ratio of the clock periods where the output level of the XOR gate is high to the total amount of clock periods.

10. The method as claimed in claim 9, comprising generating the sinusoidal electrical signal by the steps of
    combining a plurality of synchronized output signals having the test frequency, the plurality of synchronized output signals being generated by a plurality of pulse width modulation units, by weighted summing of the synchronized output signals; and applying low pass filtering to the summed output signals to generate a substantially sinusoidal test signal of the test signal frequency.

11. The method as claimed in claim 9, comprising steps of varying a relative phase shift between the sinusoidal electrical signal of the sine wave generator and the electrical signal of substantially square wave shape of the square wave generator in pre-determined steps in a pre-determined range and keep the relative phase constant for a pre-determined measurement time period, determining the capacitance in each of the measurement time periods, determining an optimum relative phase shift that corresponds to the determined capacitance of largest magnitude, adjusting the relative phase shift to the optimum relative phase shift.

* * * * *

UNITED STATES PATENT AND TRADEMARK OFFICE
CERTIFICATE OF CORRECTION

PATENT NO. : 10,222,241 B2
APPLICATION NO. : 15/525011
DATED : March 5, 2019
INVENTOR(S) : Laurent Lamesch Page 1 of 1

It is certified that error appears in the above-identified patent and that said Letters Patent is hereby corrected as shown below:

In the Specification

Column 8, Lines 45-46, replace "designed as an π-filter in n-configuration" with --designed as an LC-filter in π-configuration--.

Signed and Sealed this
First Day of October, 2019

Andrei Iancu
*Director of the United States Patent and Trademark Office*